(12) United States Patent
Oka

(10) Patent No.: US 12,740,189 B2
(45) Date of Patent: Sep. 15, 2026

(54) LIGHT-EMITTING MODULE, METHOD OF MANUFACTURING LIGHT SOURCE, AND METHOD OF MANUFACTURING LIGHT-EMITTING MODULE

(71) Applicant: NICHIA CORPORATION, Anan (JP)

(72) Inventor: Yuta Oka, Awa (JP)

(73) Assignee: NICHIA CORPORATION, Anan (JP)

( * ) Notice: Subject to any disclaimer, the term of this patent is extended or adjusted under 35 U.S.C. 154(b) by 616 days.

(21) Appl. No.: 18/188,206

(22) Filed: Mar. 22, 2023

(65) Prior Publication Data

US 2023/0317876 A1 Oct. 5, 2023

(30) Foreign Application Priority Data

Mar. 29, 2022 (JP) ................................ 2022-053831
Aug. 24, 2022 (JP) ................................ 2022-133115

(51) Int. Cl.
*H10H 20/814* (2025.01)
*H10H 20/854* (2025.01)
*H10H 20/857* (2025.01)
*H10W 90/00* (2026.01)
*H10H 20/01* (2025.01)

(52) U.S. Cl.
CPC ........ *H10H 20/814* (2025.01); *H10H 20/854* (2025.01); *H10H 20/857* (2025.01); *H10W 90/00* (2026.01); *H10H 20/0364* (2025.01)

(58) Field of Classification Search
CPC .. H10H 20/814; H10H 20/854; H10H 20/857; H01L 25/0753
See application file for complete search history.

(56) References Cited

U.S. PATENT DOCUMENTS 10,141,491 B2 * 11/2018 Miyoshi .............. H01L 25/0753
2007/0057364 A1 * 3/2007 Wang ................. H10H 20/8506 257/E25.02
2010/0244059 A1 9/2010 Iida et al.
2015/0069403 A1 * 3/2015 Suzuki ................ H10D 86/441 438/26
2015/0280052 A1 * 10/2015 Oka ..................... H10H 20/853 438/27
2015/0380622 A1 12/2015 Miyoshi et al.
(Continued)

FOREIGN PATENT DOCUMENTS

JP 2010-232577 A 10/2010
JP 2012-016318 A 1/2012
(Continued)

*Primary Examiner* — Monica D Harrison
*Assistant Examiner* — Jacob T Nelson
(74) *Attorney, Agent, or Firm* — Foley & Lardner LLP

(57) ABSTRACT

A module includes a light source and a control unit. The light source includes a plurality of light-emitting elements, a plurality of light-transmissive members, each disposed on a respective one of the plurality of light-emitting elements, and a light-reflective member covering at least a portion of the plurality of light-emitting elements and the plurality of light-transmissive members. A portion of the light-reflective member is located between adjacent ones of the plurality of light-transmissive members. The control unit has an upper surface on which the light source is located. The control unit is configured to individually control the plurality of light-emitting elements.

18 Claims, 17 Drawing Sheets

(56) References Cited

U.S. PATENT DOCUMENTS

| | | | |
|---|---|---|---|
| 2017/0179360 | A1 | 6/2017 | Miyoshi et al. |
| 2018/0175239 | A1 | 6/2018 | Hayashi |
| 2018/0358339 | A1 | 12/2018 | Iguchi |
| 2019/0131208 | A1 | 5/2019 | Feichtinger et al. |
| 2020/0152828 | A1 | 5/2020 | Hayashi |
| 2021/0135064 | A1 | 5/2021 | Ishio |
| 2021/0358897 | A1 | 11/2021 | Iguchi |
| 2021/0367096 | A1* | 11/2021 | Nishiyama ............. H10H 20/01 |
| 2022/0045123 | A1 | 2/2022 | Yang |

FOREIGN PATENT DOCUMENTS

| | | | |
|---|---|---|---|
| JP | 2014-216416 | A | 11/2014 |
| JP | 2016-027620 | A | 2/2016 |
| JP | 2018-139285 | A | 9/2018 |
| JP | 2019-514226 | A | 5/2019 |
| JP | 2021-009898 | A | 1/2021 |
| JP | 2021-057465 | A | 4/2021 |
| JP | 2021-071645 | A | 5/2021 |
| JP | 2021-182603 | A | 11/2021 |
| JP | 2022-032020 | A | 2/2022 |
| WO | WO-2017/094461 | A1 | 6/2017 |

* cited by examiner

LIGHT-EMITTING MODULE, METHOD OF MANUFACTURING LIGHT SOURCE, AND METHOD OF MANUFACTURING LIGHT-EMITTING MODULE

CROSS-REFERENCE TO RELATED APPLICATIONS

This application also claims priority to Japanese Patent Application No. 2022-053831, filed on Mar. 29, 2022, and Japanese Patent Application No. 2022-133115, filed on Aug. 24, 2022, the contents of which are incorporated by reference herein in their entireties.

BACKGROUND

The present disclosure relates to a light-emitting module, a method of manufacturing a light source, and a method of manufacturing a light-emitting module.

In recent years, a light source that uses a light-emitting element such as a light-emitting diode has been widely used. For example, Japanese Patent Laid-open Publication No. 2019-514226 discloses a multilayer carrier system that enables individual control of semiconductor elements (LEDs) via a multilayer ceramic substrate (refer to paragraph [0013] and the like).

SUMMARY

A light-emitting module according to an aspect of the present disclosure includes: a light source including a plurality of light-emitting elements, a plurality of light-transmissive members respectively disposed on each of the plurality of light-emitting elements, and a light-reflective member covering at least a portion of the plurality of light-emitting elements and the plurality of light-transmissive members; and a control unit that disposes the light source on an upper surface thereof and that is configured to individually control the plurality of light-emitting elements. The light-reflective member is disposed between light-transmissive members of the plurality of light-transmissive members that are adjacent to each other.

Further, a light-emitting module according to an aspect of the present disclosure includes: a light source including a plurality of light-emitting elements and a light-reflective member covering at least a portion of the plurality of light-emitting elements, a mounting substrate positioned on a lower side of the light source, the mounting substrate including a wiring portion disposed on an upper surface of a base member; and a plurality of conductive members provided in an interior of the light-reflective member and each including a first end portion exposed from a lower surface of the light-reflective member, and a second end portion exposed from an upper surface of the light-reflective member. The second end portion of each of the plurality of conductive members exposed from the light-reflective member and the wiring portion on the mounting substrate are electrically connected on the upper surface of the light-reflective member.

Further, a method of manufacturing a light source according to an aspect of the present disclosure includes: preparing a light-transmissive sheet; disposing a plurality of light-emitting elements with respect to the light-transmissive sheet; disposing a plurality of conductive members outward of the plurality of light-emitting elements in a top view; and covering at least a portion of the light-transmissive sheet, the plurality of light-emitting elements, and the plurality of conductive members with a light-reflective member.

Further, a method of manufacturing a light-emitting module according to an aspect of the present disclosure includes, after the method of manufacturing a light source described above, electrically connecting the light source and a control unit configured to individually control the plurality of light-emitting elements.

DETAILED DESCRIPTION

Figure 1:
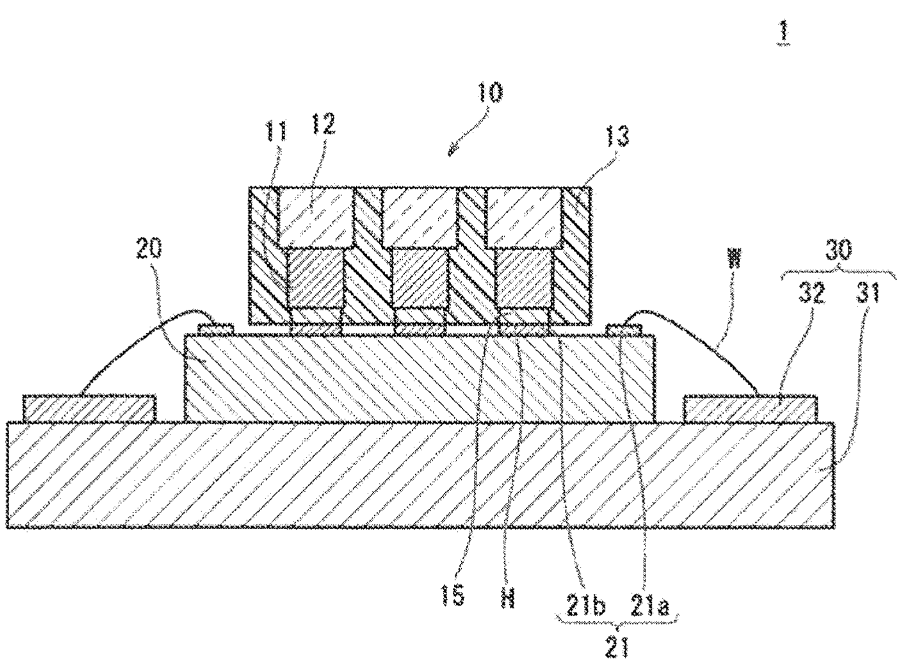
FIG. 1 is a schematic cross-sectional view illustrating a light-emitting module according to an embodiment of the present disclosure.

Hereinafter, exemplary embodiments for carrying out the present disclosure will be described with reference to the drawings. Note that the embodiments of a light-emitting module, a method of manufacturing a light source, and a method of manufacturing a light-emitting module described below are merely intended to embody the technical concepts of the present disclosure, and the present disclosure is not limited to the described embodiments unless otherwise specified.

In each drawing, members having identical functions may be denoted by the same reference characters. For ease of explanation or understanding of the points of view, the plurality of exemplary embodiments and examples may be illustrated separately for convenience, but partial substitutions or combinations of the constituent components illustrated in different embodiments and examples are possible. In the embodiments and examples described below, descriptions of matters common to those already described may be omitted, and only different features may be described. In particular, similar effects of similar configurations shall not be described each time for individual embodiments. The size, positional relationship, and the like of the members illustrated in the drawings may be exaggerated for clarity of explanation. As a cross-sectional view, an end view illustrating only a cut surface may be used.

First Embodiment

Figure 2A:
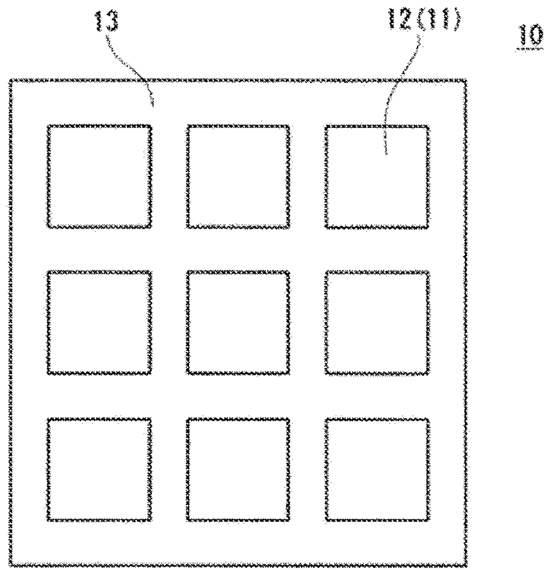
FIG. 2A is a schematic plan view illustrating a light source according to the embodiment of the present disclosure.
Figure 2B:
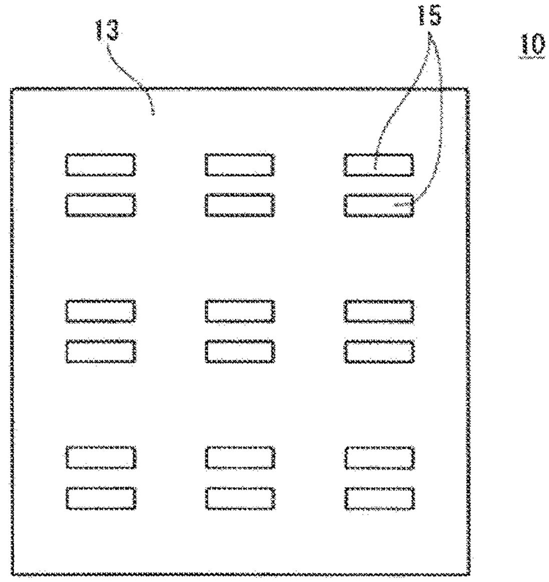
FIG. 2B is a schematic bottom view illustrating the light source according to the embodiment of the present disclosure.

A light-emitting module 1 of a first embodiment according to the present disclosure will be described in detail with reference to FIGS. 1 to 2B. The light-emitting module 1 of the first embodiment according to the present disclosure includes a light source 10 including a plurality of light-emitting elements 11, a plurality of light-transmissive members 12 respectively disposed on each of the plurality of light-emitting elements 11, and a light-reflective member 13 covering at least a portion of the plurality of light-emitting elements 11 and the plurality of light-transmissive members 12; and a control unit 20 having an upper surface on which the light source 10 is located, where the control unit 20 is configured to individually control the plurality of light-emitting elements 11. The light-reflective member 13 is disposed between light-transmissive members of the plurality of light-transmissive members 12 that are adjacent to each other. Such a light-emitting module 1 makes it not necessary to secure respective areas occupied by the light source 10 and the control unit 20 in a top view. Thus, it is possible to reduce a size of the light-emitting module 1 in a top view. Further, the light-reflective member 13 disposed between the light-transmissive members of the plurality of light-transmissive members 12 that are adjacent to each other makes it possible to reduce, at a light-emitting surface, an incidence of light emitted by one light-emitting element 11 through the light-transmissive member 12 onto a light-emitting region irradiated with light by the adjacent light-emitting element through the light-transmissive member. This makes it possible to achieve a light-emitting module having favorable parting properties between a light-emitting region and a non-light-emitting region. In the present specification, favorable parting properties of a light-emitting region and a non-light-emitting region may mean, in other words, high contrast between the light-emitting region and the non-light-emitting region.

Below, constituent members of the light-emitting module according to the first embodiment will be described with reference to FIGS. 1 to 2B.

Light Source

The light source 10 includes the plurality of light-emitting elements 11, the plurality of light-transmissive members 12 respectively disposed on each of the plurality of light-emitting elements 11, and the light-reflective member 13 covering at least a portion of the plurality of light-emitting elements 11 and the plurality of light-transmissive members 12. The light source 10 exemplified in FIG. 1 includes an upper surface as a light-emitting surface and a lower surface, on a side opposite to the upper surface, as a mounting surface.

Light-Emitting Element

The plurality of light-emitting elements 11 are individually operable by the control unit 20 described below. As illustrated in FIG. 2A, the plurality of light-emitting elements 11 are preferably disposed in a square lattice pattern or a rectangular lattice pattern in a top view. In FIG. 2A, a form is exemplified in which the light-emitting elements 11 are disposed in a square lattice pattern of three rows and three columns. The plurality of light-emitting elements 11 may be arranged at regular intervals in a vertical direction and a horizontal direction. Note that examples of a shape of the light-emitting element 11 in a top view include a quadrangular shape including a square shape, another polygonal shape such as a triangular or hexagonal shape, a circular shape, or an elliptical shape.

Electrodes 15 including a positive electrode and a negative electrode are preferably provided on a surface of the light-emitting element 11 opposite to the light-emitting surface. This makes it possible for a current to flow to the light-emitting elements 11 through the positive and negative electrodes 15.

The light-emitting element 11 is preferably a semiconductor such as a III-V compound semiconductor or a II-VI compound semiconductor. As the semiconductor, preferably, a nitride-based semiconductor such as $In_xAl_yGa_{1-x-y}N$ ($0 \le X$, $0 \le Y$, $X+Y \le 1$) or the like is used, and InN, AlN, GaN, InGaN, AlGaN, InGaAlN, and the like can also be used.

Light-Transmissive Member

The light-transmissive member 12 is a plate-like member having a substantially rectangular shape in a top view and covers an upper surface of the light-emitting element 11. As the light-transmissive member 12, a member having a rectangular shape in a range from 100 μm square to 300 μm square, for example, may be used. The light-transmissive member 12 can be formed using a light-transmissive resin material or an inorganic material such as ceramic or glass. A thermosetting resin, such as a silicone resin, a silicone modified resin, an epoxy resin, or a phenol resin, can be used as the resin material. Further, a thermoplastic resin such as a polycarbonate resin, an acrylic resin, a methyl pentene resin, or a polynorbornene resin can be used. Particularly, a silicone resin or a modified silicone resin with excellent light resistance and heat resistance is suitable. Note that "light-transmissive" refers to a property that allows 60% or more of the light from the light-emitting element 11 to be transmitted. Furthermore, the light-transmissive member 12 may contain a wavelength conversion substance that converts the wavelength of at least a portion of light from a light diffusion member or the light-emitting element 11. Examples of the light-transmissive member 12 containing a wavelength conversion substance include a member containing a wavelength conversion substance in the resin material described above, ceramic, glass, or the like, and a sintered body of a wavelength conversion substance. Further, the light-transmissive member 12 may be a member obtained by forming a resin layer containing a wavelength conversion substance or a light diffusion member on a lower surface of a molded body of a resin, glass, ceramic, or the like.

Examples of the wavelength conversion substance included in the light-transmissive member 12 include a yttrium aluminum garnet phosphor (for example, $Y_3(Al, Ga)_5O_{12}$:Ce), a lutetium aluminum garnet phosphor (for example, $Lu_3(Al, Ga)_5O_{12}$:Ce), a terbium aluminum garnet phosphor (for example, $Tb_3(Al, Ga)_5O_{12}$:Ce), a CCA phosphor (for example, $Ca_{10}(PO_4)_6Cl_2$:Eu), an SAE phosphor (for example, $Sr_4Al_{14}O_{25}$:Eu), a chlorosilicate phosphor (for example, $Ca_8MgSi_4O_{16}Cl_2$:Eu), a nitride phosphor, a fluoride phosphor, a phosphor having a perovskite structure (for example, CsPb $(F, Cl, Br, I)_3$), and a quantum dot phosphor (for example, CdSe, InP, $AgInS_2$, $AgInGaS_2$, $CuAgInS_2$, or $AgInSe_2$). Examples of a nitride phosphor include a β-sialon phosphor (for example, $(Si, Al)_3(O, N)_4$:Eu), an α-sialon phosphor (for example, Ca $(Si, Al)_{12}(O, N)_{16}$:Eu), an SLA phosphor (for example, $SrLiAl_3N_4$:Eu), a CASN phosphor (for example, $CaAlSiN_3$:Eu), a SCASN phosphor (for example, $(Sr, Ca)AlSiN_3$:Eu), and the like; and examples of a fluoride phosphor include a KSF phosphor (for example, $K_2SiF_6$:Mn), a KSAF phosphor (for example, $K_2(Si, Al)F_6$:Mn), and an MGF phosphor (for example, 3.5 MgO 0.5 $MgF_2GeO_2$:Mn). The phosphors described above are particles. Further, one type of these wavelength conversion substances can be used alone, or two or more types of these wavelength conversion substances can be used in combination.

The KSAF based phosphor may have a composition represented by Formula (I).

$$M_2[Si_pAl_qMn_rF_s] \quad (I)$$

In Formula (I), M represents an alkali metal and may include at least K. Mn may be a tetravalent Mn ion. p, q, r, and s may satisfy $0.9 \le p+q+r \le 1.1$, $0 < q \le 0.1$, $0 < r \le 0.2$, $5.9 \le s \le 6.1$. Preferably $0.95 \le p+q+r \le 1.05$ or $0.97 \le p+q+r \le 1.03$, $0 < q \le 0.03$, $0.002 \le q \le 0.02$ or $0.003 \le q \le 0.015$, $0.005 \le r \le 0.15$, $0.01 \le r \le 0.12$ or $0.015 \le r \le 0.1$, $5.92 \le s \le 6.05$ or $5.95 \le s \le 6.025$. Examples of the composition represented by Formula (I) include compositions represented by $K_2[Si_{0.946}Al_{0.005}Mn_{0.049}F_{5.995}]$, $K_2[Si_{0.942}Al_{0.008}Mn_{0.050}F_{5.992}]$, $K_2[Si_{0.939}Al_{0.014}Mn_{0.047}F_{5.986}]$. Such a KSAF based phosphor enables red light emission having a high luminance and a narrow half-value width of the light emission peak wavelength.

In a case in which white light is emitted from the light source 10, a light-emitting element that emits blue light and a light-transmissive member 12 containing a wavelength conversion substance that emits yellow light by the light from the light-emitting element can be combined, for example.

Examples of the light diffusion member included in the light-transmissive member 12 include titanium oxide, barium titanate, aluminum oxide, and silicon oxide.

A top view shape of the light-transmissive member 12 may be a shape corresponding to the shape of the light-emitting element 11. That is, the shape can be a polygonal shape such as a triangular shape, a quadrangular shape, or a hexagonal shape, a circular shape, or an elliptical shape. In a top view, an outer edge of the light-transmissive member 12 may be positioned outward of an outer edge of the light-emitting element 11. This makes it possible to cause the light emitted from the light-emitting element 11 to be appropriately incident on the light-transmissive member 12.

Light-Reflective Member

The light-reflective member 13 is disposed between light-transmissive members of the plurality of light-transmissive members 12 that are adjacent to each other. The light-reflective member 13 is a member that covers the plurality of light-emitting elements 11 and the plurality of light-transmissive members 12 collectively. In other words, the light-reflective member 13 is a member that is positioned between adjacent light-emitting elements 11 or between adjacent light-transmissive members 12, and holds each of the light-emitting elements 11 and each of the light-transmissive members 12. With the light-reflective member 13 disposed between the adjacent light-transmissive members 12, it is possible to reduce, at the light-emitting surface, the incidence of light emitted by one light-emitting element 11 through the light-transmissive member 12 onto the light-emitting region irradiated with light by the adjacent light-emitting element through the light-transmissive member. This makes it possible to achieve a light-emitting module having favorable parting properties between a light-emitting region and a non-light-emitting region. A width of the light-reflective member 13 positioned between the adjacent light-emitting elements 11 at the light-emitting surface is, for example, in a range from 5 μm to 100 μm, preferably in a range from 10 μm to 70 μm, and more preferably in a range from 15 μm to 50 μm. This makes it possible to achieve a light-emitting module having favorable parting properties between a light-emitting region and a non-light-emitting region while reducing a size of the light source 10.

An upper surface of the light-transmissive member 12 is exposed from the light-reflective member 13 and constitutes the light-emitting surface of the light source 10. The light-emitting surface is a primary light extraction surface. The light-reflective member 13 is preferably constituted by a member having a high light reflectivity in order to improve a light extraction efficiency.

As the light-reflective member 13, a resin material containing a light-reflective material such as white pigment, for example, can be used. Examples of light-reflective materials include titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide, and silicon oxide. One of these is preferably used alone, or a combination of two or more types thereof are preferably used. The resin material is preferably a material in which a resin material including a thermosetting resin, such as an epoxy resin, a silicone resin, a silicone modified resin, a phenol resin, or the like as a main component is used as a base material.

Control Unit

The control unit 20 is disposed between a mounting substrate 30 described below and the light source 10, and individually controls the plurality of light-emitting elements 11. An external connection terminals including a terminal for applying a current and a terminal for inputting or outputting an electrical signal is provided on the upper surface of the control unit 20. Specifically, the upper surface of the control unit 20 includes external connection terminals 21*a* electrically connected to the mounting substrate 30, and a plurality of terminals 21*b* provided correspondingly to the plurality of light-emitting elements 11. Examples of the plurality of terminals 21 include control input signal terminals and output signal terminals that individually control a cathode terminal and an anode terminal of each light-emitting element 11.

The control unit 20 preferably has substantially the same outer shape as that of the light source 10 in a top view. In a top view, a planar area of the control unit 20 is preferably substantially equal to a planar area of the light source 10. Here, the planar areas of the control unit 20 and the light source 10 being "substantially equal" refers to the planar area of the control unit 20 encompassing a range of ±20% with respect to the planar area of the light source 10. As a result, the area occupied by the light-emitting module in a top view is readily substantially the same as the area occupied by the light source 10, making it possible to reduce enlargement of the light-emitting module. In the present specification, the planar area refers to an area in a plan view.

The external connection terminal 21*a* positioned on the upper surface of the control unit 20 is electrically connected to a wiring portion 32 of the mounting substrate 30 described below by wire bonding, for example. Thus, the electrical signal output from the mounting substrate 30 can be supplied to the control unit 20.

The terminal 21*b* positioned on the upper surface of the control unit 20 is connected, via a conductive joining member, for example, to a plurality of the electrodes 15 exposed from the light-reflective member 13 on a lower surface of the light-reflective member 13. This allows an electrical signal output from outside the light-emitting module 1 to be supplied to the light-emitting element 11.

Mounting Substrate

The mounting substrate 30 is disposed below the control unit 20 and includes a base member 31 and the wiring portion 32. As the base member 31, an insulating material is preferably used, and a material through which light emitted from the light source 10, external light, and the like are not readily transmitted is preferably used. Further, as the base member 31, a material having a certain degree of strength is preferably used. Specifically, the base member 31 used can be a ceramic such as alumina, aluminum nitride, or mullite, a resin such as phenol resin, epoxy resin, polyimide resin, bismaleimide triazine resin (BT resin), or polyphthalamide, or the like.

As the wiring portion 32, preferably, a metal material to which a wire W is readily joined by wire bonding is used. Preferably, for example, a member constituted by at least one of copper, iron, nickel, tungsten, chromium, aluminum, silver, gold, titanium, palladium, rhodium, alloys thereof, or the like is used. As a result, the wiring portion 32 positioned on the mounting substrate 30 and the external connection terminal 21*a* positioned on the upper surface of the control unit 20 can be electrically connected by the wire W.

Modified Example of Light-Emitting Module of First Embodiment

Figure 3A:
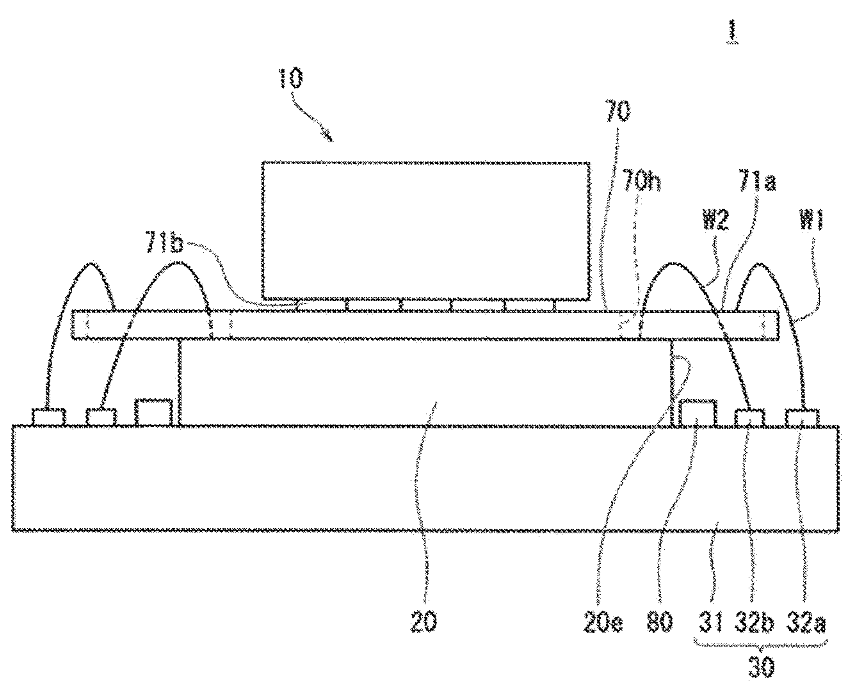
FIG. 3A is a schematic front view illustrating a modified example of the light-emitting module according to the embodiment of the present disclosure.

Next, a modified example of the light-emitting module 1 of the first embodiment according to the present disclosure will be described with reference to FIGS. 3A to 3C. The light-emitting module 1 of the modified example of the first embodiment according to the present modified example includes the light source 10 described in the first embodiment above, a submount substrate 70 in which the light source 10 is disposed on an upper surface thereof and electrical wiring is performed, the control unit 20 disposed below the submount substrate 70 and configured to individually control the plurality of light-emitting elements 11, and the mounting substrate 30 disposed below the control unit 20. Note that, in this description, points different from those of the light-emitting module described in the first embodiment above will be mainly described.

Submount Substrate

Figure 3B:
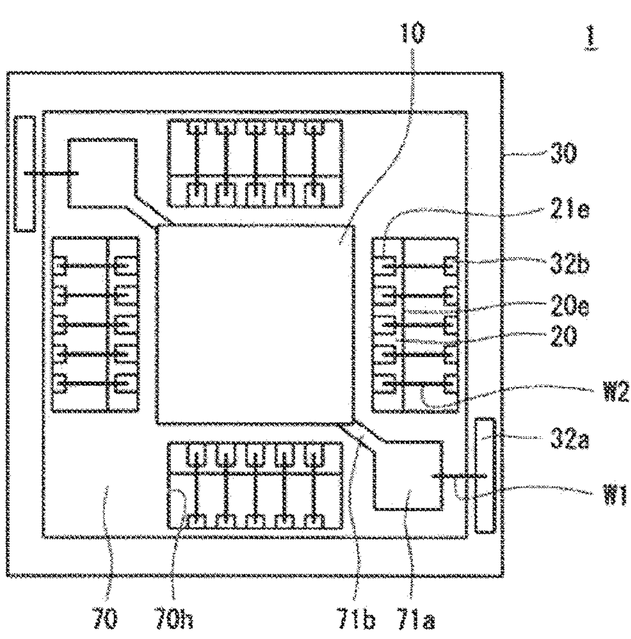
FIG. 3B is a schematic plan view illustrating the modified example of the light-emitting module according to the embodiment of the present disclosure.

The submount substrate 70 is a substrate having a substantially rectangular shape in a plan view, as illustrated in FIG. 3B. In the present embodiment, in a plan view, an outer edge of the submount substrate 70 is positioned outward of an outer edge of the light source 10 and an outer edge of the control unit 20. An electronic component 80 such as a chip resistor and/or a capacitor described below can be disposed below the submount substrate 70. Specifically, the electronic component 80, in a plan view, can be disposed below the submount substrate 70 and between the outer edge of the submount substrate 70 and the control unit 20. This makes it possible to reduce the light emitted by the light source 10 that reaches the electronic component 80, and reduce absorption of a portion of the light emitted by the light source 10 into the electronic component 80 having a black surface, for example. Further, with the electronic component disposed below the submount substrate 70, the electronic component 80 is not readily visually recognized in a plan view, improving the aesthetics of the light-emitting module 1.

The submount substrate 70 may be provided with a plurality of openings 70*h* surrounding a region where the light source 10 is disposed. The opening 70*h* is a space for disposing a wire W2 that electrically connects the control unit 20 and the mounting substrate 30. That is, with the opening 70*h* provided in the submount substrate 70, the wire W2 that electrically connects the control unit 20 and the mounting substrate 30 enters the opening 70*h*, and prevents the wire W2 from coming into contact with the submount substrate 70. Furthermore, through the opening 70*h* in a plan view, it is also possible to confirm that the control unit 20 and the mounting substrate 30 are appropriately electrically connected by the wire W2.

A pair of corner portions on the upper surface of the submount substrate 70 may each be provided with a pad 71*a* for supplying electricity to the light source 10. In the present embodiment, the pads 71*a* are disposed on a diagonal line on the submount substrate 70. Note that the arrangement of the pads 71*a* is not limited thereto.

Each pad 71*a* may be provided with a lead wiring 71*b* for electrical connection to an anode electrode or a cathode electrode of the light source 10. This lead wiring 71*b* may be partially layered and wired via an insulating layer.

As a base body of the submount substrate 70, an insulating material is preferably used, and a material through which light emitted from the light source 10, external light, and the like are not readily transmitted is preferably used. Further, as the submount substrate 70, a material having a certain degree of strength is preferably used. Specifically, an aluminum nitride substrate or a silicon nitride substrate is preferred.

Control Unit

Figure 3C:
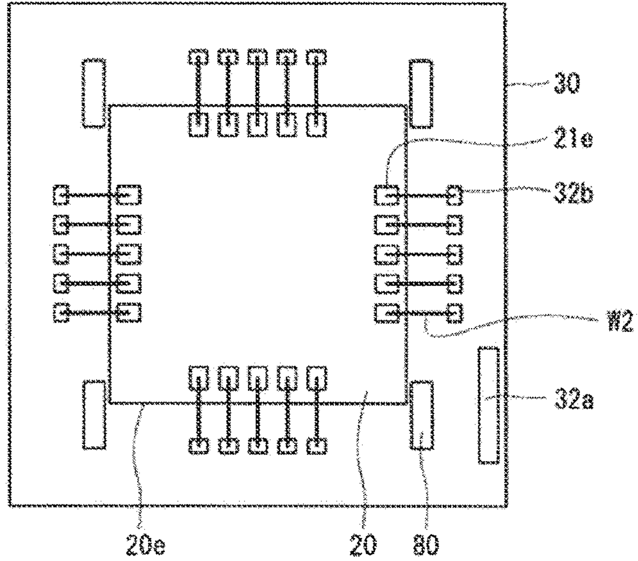
FIG. 3C is a schematic plan view of a control unit and a mounting substrate of the modified example of the light-emitting module according to the embodiment of the present disclosure.

As illustrated in FIG. 3C, the control unit 20 has a substantially rectangular shape in a plan view, and is disposed on the mounting substrate 30. In a top view, the planar area of the control unit 20 may be in a range of ±20% with respect to the planar area of the light source 10. Then, in the control unit 20, a terminal 21*e* for electrical connection to the mounting substrate 30 may be disposed near an outer edge 20*e* visually recognizable from the opening 70*h*. In the present modified example, as illustrated in FIGS. 3B and 3C, four terminals 21*e* can be visually recognized per opening 70*h*.

Mounting Substrate

The mounting substrate 30, as illustrated in FIG. 3C, has a substantially rectangular shape in a plan view. The mounting substrate 30 may be provided with a submount substrate electrode 32*a* for electrical connection to the submount substrate 70 and a control unit electrode 32*b* for electrical connection to the control unit 20.

The submount substrate electrode 32*a* may be disposed near the pad 71*a* of the submount substrate 70. Specifically, the submount substrate electrode 32*a* may be disposed in a corner portion of the mounting substrate 30 corresponding to the pad 71*a* of the submount substrate 70. Such an arrangement makes it possible to shorten a wire W1 to the extent possible and thus reduce wiring resistance.

The control unit electrode 32*b* may be disposed adjacent to the terminal 21*e* of the control unit 20. Specifically, the control unit electrode 32*b* may be disposed at a position visually recognizable from the opening 70*h* of the submount substrate 70 in a plan view, in correspondence with the terminal 21*e* of the control unit 20. Such an arrangement makes it possible to shorten the wire W2 to the extent possible and thus reduce wiring resistance.

The mounting substrate 30 may be provided with the electronic component 80 (such as a chip resistor and/or a capacitor). As an example, the electronic component 80 may be disposed below the submount substrate 70 in a plan view. Specifically, the electronic component 80 may be disposed below a corner position of the submount substrate 70. With the electronic component 80 disposed in such a position, it is possible to reduce the light emitted by the light source 10 that reaches the electronic component 80, and reduce absorption of a portion of the light emitted by the light source 10 into the electronic component 80 having a black surface, for example. Further, with the electronic component disposed below the submount substrate 70, the electronic component 80 is not readily visually recognizable in a plan view, improving the aesthetics of the light-emitting module 1 in a plan view.

Second Embodiment

Figure 4:
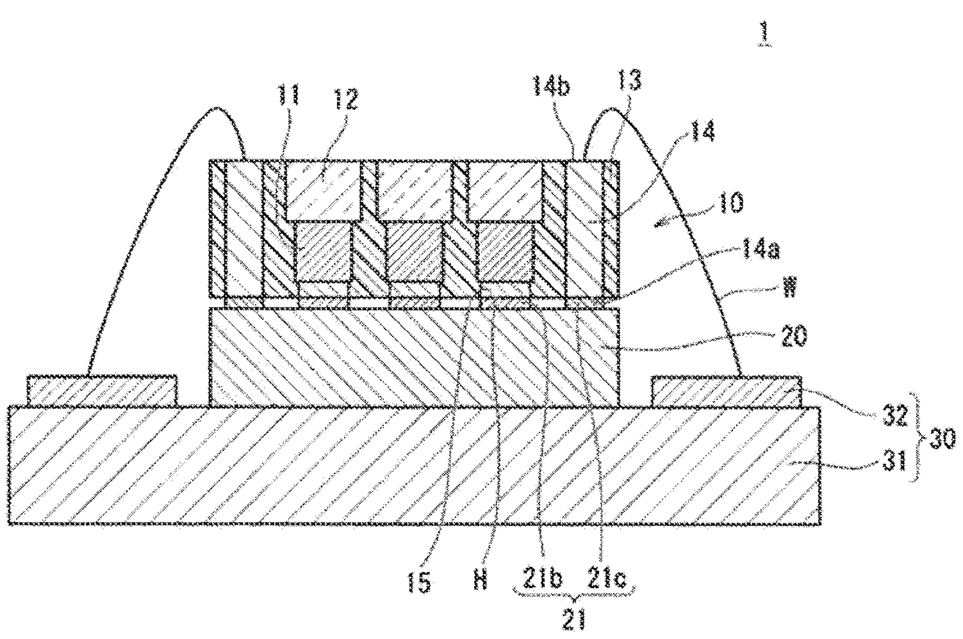
FIG. 4 is a schematic cross-sectional view illustrating a light-emitting module according to another embodiment.

Next, a light-emitting module 1 of a second embodiment according to the present disclosure will be described with reference to FIGS. 4 to 5B. Note that, in this description, points different from those of the light-emitting module described in the first embodiment above are mainly described.

Figure 6:
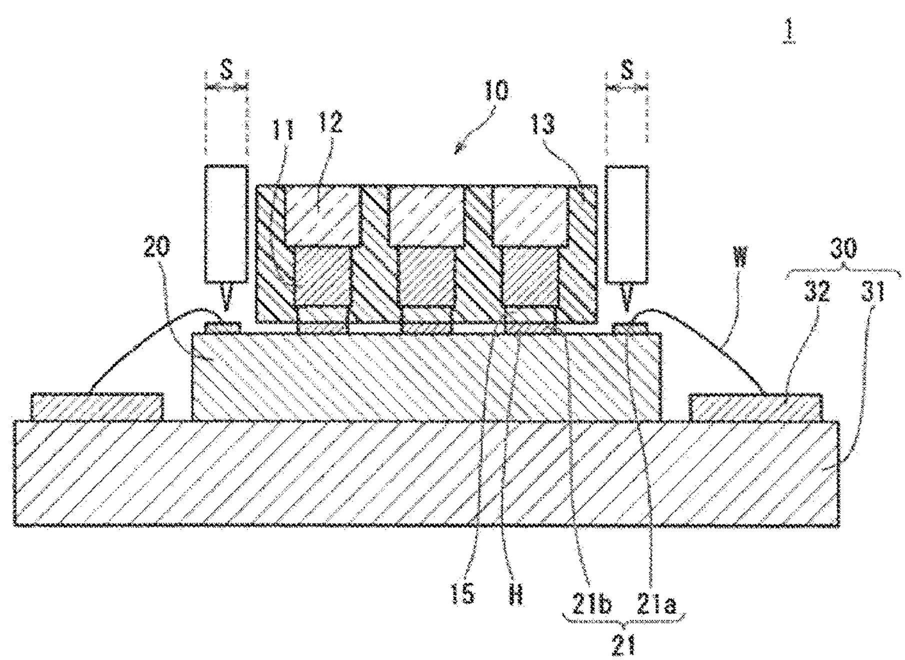
FIG. 6 is a schematic cross-sectional view illustrating a state in which wire bonding is applied to the light-emitting module.

The light-emitting module 1 of the second embodiment according to the present disclosure includes the light source 10 including the plurality of light-emitting elements 11 and the light-reflective member 13 covering at least a portion of the plurality of light-emitting elements 11, the mounting substrate 30 positioned on a lower side of the light source 10 and in which the wiring portion 32 is disposed on an upper surface of the base member 31, and the plurality of conductive members 14 provided in an interior of the light-reflective member 13 and each including a first end portion 14*a* exposed from the light-reflective member on a lower surface of the light-reflective member 13, and the second end portion 14*b* exposed from the light-reflective member on an upper surface of the light-reflective member 13. The second end portion 14*b* of each of the plurality of conductive members 14 exposed from the light-reflective member 13 and the wiring portion 32 on the mounting substrate are electrically connected on the upper surface of the light-reflective member 13. In such a light-emitting module 1, the conductive member 14 in the interior of the light-reflective member 13 and the wiring portion 32 on the mounting substrate are electrically connected. Thus, although, for example, a space SP for wire bonding is required in a case in which a light-emitting module does not include a conductive member, such as that in FIG. 6, there is no need to secure the space SP described above in the light-emitting module of the present disclosure. This makes it possible to provide a light-emitting module that can be made even smaller in size, the method of manufacturing a light source, and the method of manufacturing a light-emitting module.

Below, constituent members of the light-emitting module according to the second embodiment will be described.

Light Source

The light source 10 includes the plurality of light-emitting elements 11, the light-reflective member 13 covering at least a portion of the plurality of light-emitting elements 11, and the conductive members 14 provided in the interior of the light-reflective member 13. In the present disclosure, the light-transmissive member 12 may be optionally added.

Light-Emitting Element

Figure 5A:
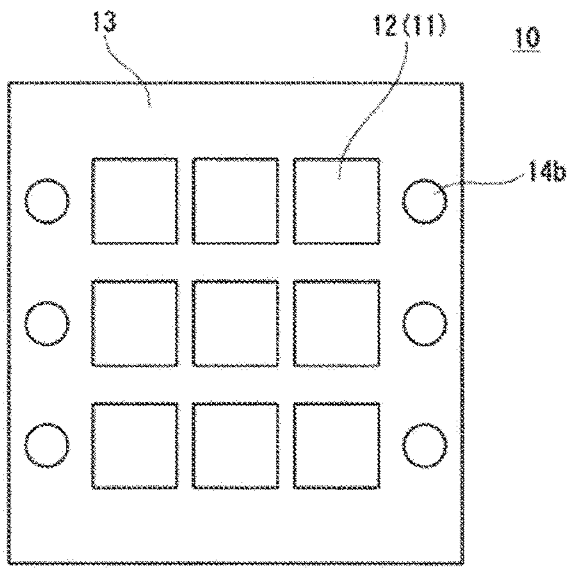
FIG. 5A is a schematic plan view illustrating a light source according to the other embodiment.
Figure 5B:
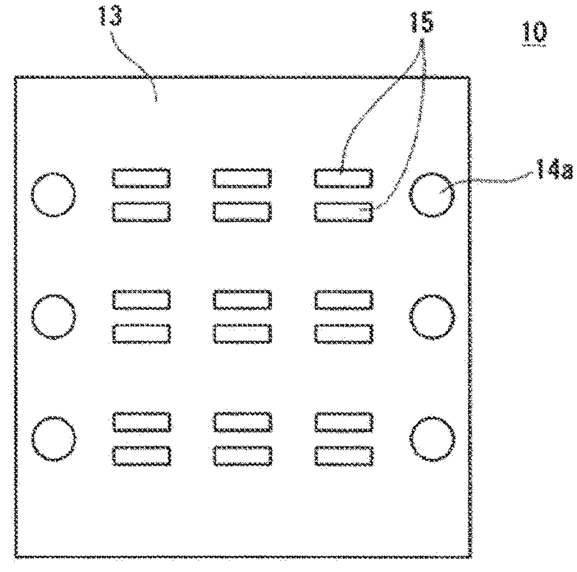
FIG. 5B is a schematic bottom view illustrating the light source according to the other embodiment.

As illustrated in FIG. 5A, the plurality of light-emitting elements 11 are preferably disposed in a rectangular shape as a whole in a top view. Note that, in FIG. 5A, a form is exemplified in which the light-emitting elements 11 are disposed in a square lattice pattern of three rows and three columns.

Conductive Member

The light-emitting module according to the second embodiment includes the conductive member 14. The conductive member 14 is a member having conductivity and provided in an interior of the light-reflective member 13 described above. Note that "conductivity" refers to a volume resistivity of the semiconductor being $10^7$ Ω·cm or less, and preferably refers to the volume resistivity being $10^{-7}$ Ω·cm or less. As the conductive member 14, a member constituted by at least one of copper, iron, nickel, tungsten, chromium, aluminum, silver, gold, titanium, palladium, rhodium, or alloys thereof can be used, for example. Copper is particularly suitable in terms of electrical conductivity.

The conductive member 14 is used as a wiring for individually controlling the plurality of light-emitting elements 11, and thus a plurality of the conductive members 14 are preferably provided. In FIGS. 5A and 5B, six conductive members 14 are disposed. The plurality of conductive members 14 each include the first end portion 14*a* exposed from the light-reflective member on the lower surface of the light-reflective member 13 and the second end portion 14*b* exposed from the light-reflective member on the upper surface of the light-reflective member 13. The first end portion 14*a* of the conductive member 14 may be electrically connected to the external connection terminal 21*c* positioned on the upper surface of the control unit 20 described below. Note that the number of the conductive members 14 is not limited to the above, and can vary depending on the number of light-emitting elements, the wiring method, and the like.

The conductive member 14 according to the second embodiment has a width at the first end portion 14*a* and a width at the second end portion 14*b* that are substantially identical. Note that the width of the first end portion 14*a* of the conductive member 14 may be greater than the width of the second end portion 14*b*. With the width of the first end portion 14*a* of the conductive member 14 being greater than the width of the second end portion 14*b*, the electrical connection between the first end portion 14*a* of the conductive member 14 and the control unit 20 can be easily made. Further, with the width of the second end portion 14*b* being smaller, a size of the region of the conductive member 14 exposed from the upper surface of the light source 10 is reduced, making it possible to reduce a size of the region where a resin member 40 described below is disposed. This allows the conductive member 14 to be covered by a small amount of the resin member 40, thereby reducing unintentional placement of the resin member 40 on the upper surface of the light-transmissive member 12 and the emitted light of the light source 10 being adversely affected. Note that the width of the first end portion 14*a* of the conductive member 14 may be smaller than the width of the second end portion 14*b*. With such a configuration, the wire bonding of the conductive member 14 to the second end portion 14*b* can be easily performed.

The plurality of conductive members 14 are each positioned between an end portion of the light source 10 and the light-emitting element 11 positioned at an outermost portion, in a top view. In other words, the conductive members 14 are disposed outward of the light-emitting region of the light-emitting element 11. The conductive members 14 according to the second embodiment are disposed with the light-emitting elements 11 interposed therebetween. Such an arrangement of the conductive member 14 reduces obstruction of the light emitted by the light source 10 by the wire W electrically connected to the conductive member 14. Note that, as illustrated in FIGS. 5A and 5B, the conductive member 14 has a circular shape in a top view, but may have a polygonal shape such as a triangular shape, a quadrangular shape, or a hexagonal shape, or an elliptical shape. The conductive member 14 has, for example, a circular shape with a diameter in a range from 30 μm to 100 μm.

Control Unit

The upper surface of the control unit 20 includes a plurality of external connection terminals 21*c* corresponding to the plurality of conductive members 14 described above, and the plurality of terminals 21*b* provided correspondingly to the plurality of light-emitting elements 11. As an example, the external connection terminals 21*c* are electrically connected, via a joining member having conductivity, to the first end portions 14*a* of the plurality of conductive members 14 exposed from the light-reflective member 13 on the lower surface of the light-reflective member 13. This allows an electrical signal output from outside the light-emitting module 1 to be supplied to the light-emitting element 11.

First Modified Example of Light-Emitting Module of Second Embodiment

Figure 7:
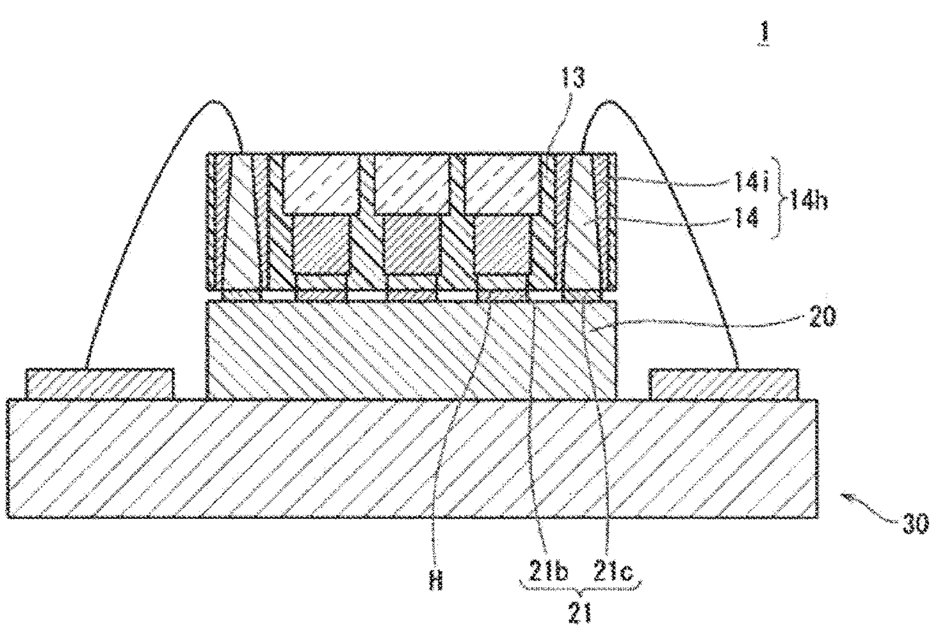
FIG. 7 is a schematic cross-sectional view illustrating a light-emitting module according to a first modified example of the other embodiment.

Next, a modified example 1 of the second embodiment will be described with reference to FIGS. 7 to 9. The present modified example differs in form from the light-emitting module and the conductive member according to the second embodiment, and other configurations are similar to those of the light-emitting module according to the second embodiment. In the present modified example, a holding member 14*h* in which a conductive member is disposed in a base material is used.

The holding member 14*h* includes the plurality of conductive members 14, and a base material 14*i* in which the plurality of conductive members 14 are disposed. With such a configuration, the holding member 14*h* in which the plurality of conductive members 14 are disposed in the base material 14*i* can be handled as a single part. This makes it possible to easily incorporate the plurality of conductive members 14 into the light-reflective member 13 from the perspective of manufacturing. Further, the holding member 14*h* also acts as a reinforcing member for increasing a strength of the light-reflective member 13.

As an example of the base material 14*i*, an inorganic material can be used, and examples of the inorganic material include a ceramic substrate such as aluminum nitride or silicon nitride. The holding member 14*h* can be formed by forming through-vias in the base material 14*i*, and filling the through-vias with the conductive members 14. Note that, instead of this formation technique, the plurality of conductive members 14 may be juxtaposed and the base material 14*i* of a ceramic material or the like may be subsequently disposed around the conductive members 14 and sintered to form the holding member 14*h*.

Figure 8A:
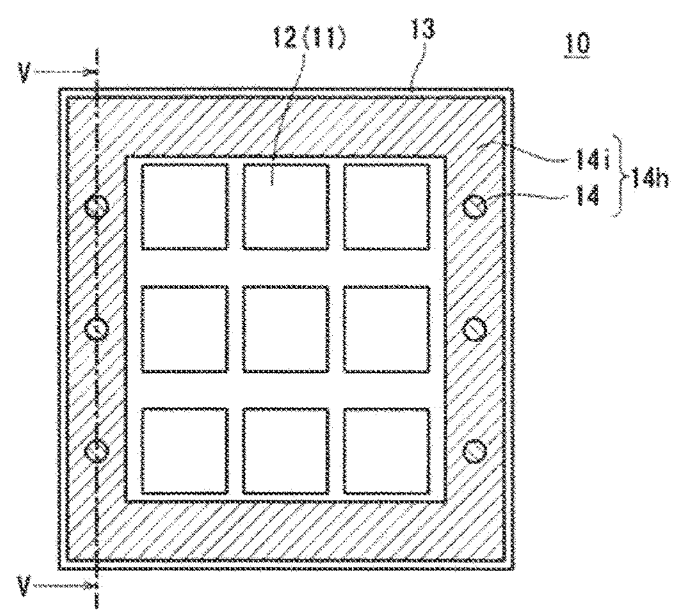
FIG. 8A is a schematic plan view illustrating a light source according to the first modified example of the other embodiment.
Figure 8B:
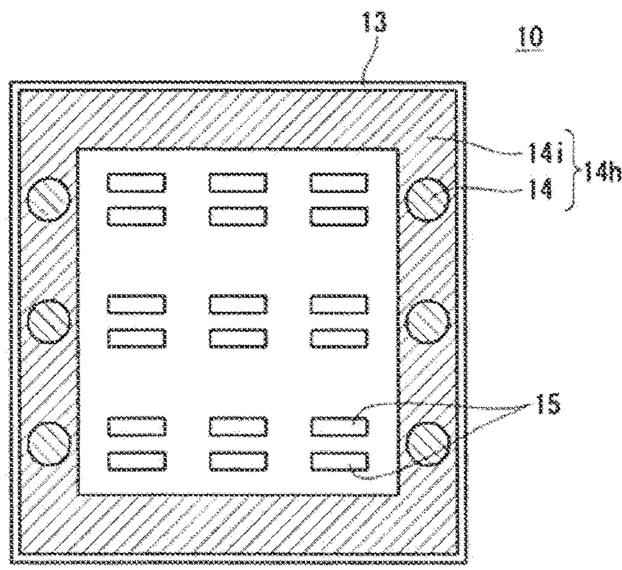
FIG. 8B is a schematic bottom view illustrating the light source according to the first modified example of the other embodiment.

As illustrated in FIGS. 8A and 8B, the holding member 14*h* may have a shape surrounding the plurality of light-emitting elements 11. That is, the holding member 14*h* may have a shape extending along a shape of an outermost edge of the light source 10 in a top view. Note that the shape of the holding member 14*h* may be changed to a shape extending along one side of the light source 10 without surrounding the light-emitting elements 11. Further, the holding member 14*h* may be provided along two sides of the light source 10 facing each other.

Figure 9:
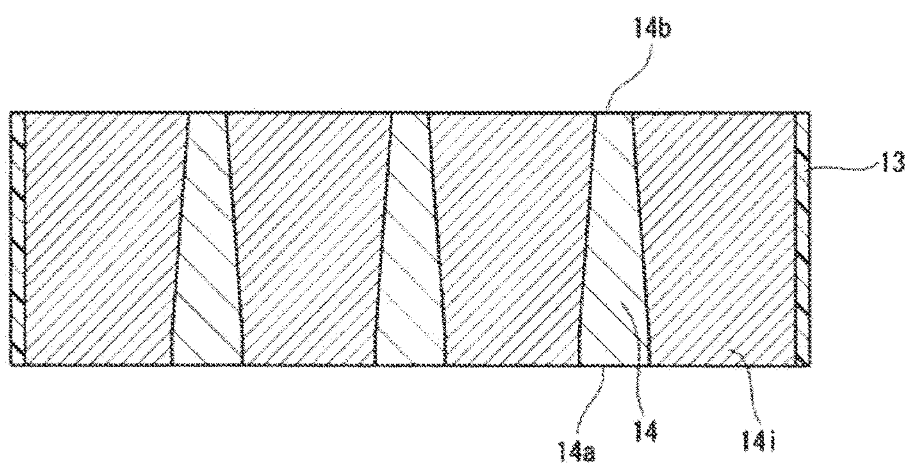
FIG. 9 is a schematic cross-sectional view in the arrow direction taken along line V-V in FIG. 8A.

As illustrated in FIG. 9, the conductive member 14 may have a width at the first end portion 14*a* that is greater than the width at the second end portion 14*b*. With such a configuration, the electrical connection between the first end portion 14*a* of the conductive member 14 and the control unit 20 can be easily made. Further, with the width of the second end portion 14*b* being smaller, the size of the region of the conductive member 14 exposed from the upper surface of the light source 10 is reduced, making it possible to reduce the size of the region where the resin member 40 described below is disposed. This allows the conductive member 14 to be covered by a small amount of the resin member 40, thereby reducing unintentional placement of the resin member 40 on the upper surface of the light-transmissive member 12 and the emitted light of the light source 10 being adversely affected.

Second Modified Example of Light-Emitting Module

Next, a second modified example of the present embodiment will be described with reference to FIGS. 10A and 10B. The present modified example differs in form from the light-emitting module and the conductive member according to the second embodiment, and other configurations are similar to those of the light-emitting module according to the second embodiment. In the present modified example, in a top view, at least one conductive member 14 is disposed on an extending line of the light-reflective member 13 positioned between adjacent light-emitting elements 11 of the plurality of light-emitting elements 11, between, for example, columns where the light-emitting elements are disposed and/or rows where the light-emitting elements are disposed. In other words, the conductive member 14 defines the light-emitting elements 11.

In this way, the conductive member 14 is provided in the light-reflective member 13 between the adjacent light-emitting elements 11, and thus has the effect of reinforcing the light-reflective member 13. Furthermore, by defining the light-emitting elements 11 with the conductive member 14, it is possible to further reduce light interference between the adjacent light-emitting elements 11. Note that, in FIGS. 10A and 10B, the conductive member 14 is provided at all positions of the adjacent light-emitting elements 11 in the light-reflective member 13, but the conductive member 14 may be provided at any one position of the adjacent light-emitting elements from the perspective of increasing the strength of the light-reflective member 13.

Third Modified Example of Light-Emitting Module

Figure 11:
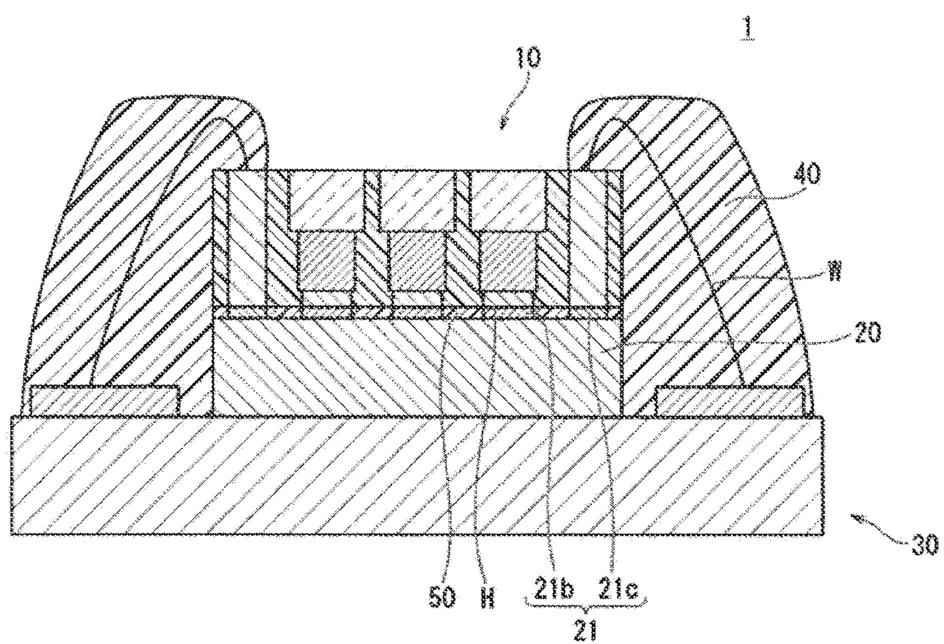
FIG. 11 is a schematic cross-sectional view illustrating a light-emitting module according to a third modified example of the other embodiment.

Next, a third modified example of the present embodiment will be described with reference to FIG. 11. The present modified example differs from the light-emitting module according to the second embodiment in including the resin member 40 and an insulating joining member 50. In the present modified example, in addition to a joining member H electrically connecting the light source 10 and the control unit 20, the insulating joining member 50 positioned between the light source 10 and the control unit 20 and joining the light source 10 and the control unit 20 is disposed. The insulating joining member 50 prevents electrical short-circuits between the terminals 21 of the control unit 20 and between the electrodes 15 of the light-emitting elements 11. The light source 10 and the control unit 20 can be firmly adhered by the insulating joining member 50.

The insulating joining member 50 is, for example, a resin material, and a thermosetting resin, such as a silicone resin, a silicone modified resin, an epoxy resin, or a phenol resin, can be used. Further, a thermoplastic resin such as a polycarbonate resin, an acrylic resin, a methyl pentene resin, or a polynorbornene resin can be used. Particularly, a silicone resin or a modified silicone resin with excellent light resistance and heat resistance is suitable. The insulating joining member 50 may include a light diffusion member such as titanium oxide, barium titanate, aluminum oxide, or silicon oxide. As a result, of the light emitted from the light source 10, light emitted downward is reflected by the insulating joining member 50, facilitating upward light extraction.

Further, in the present modified example, the second end portion 14*b* of each of the plurality of conductive members 14 exposed from the light-reflective member 13 is covered by the resin member 40 on the upper surface of the light-reflective member 13. The resin member 40 is preferably an insulating material to prevent electrical short-circuits with the conductive member 14. That is, the resin member 40 can function as a protective member for the conductive member 14 to prevent unexpected electrical short-circuits. Note that the resin member 40 is preferably formed of the same material as that of the light-reflective member 13 covering the conductive member 14 from the perspective of material cost, but may be formed of a material different from that of the light-reflective member 13 covering the conductive member 14.

Further, the resin member 40 of the present modified example covers the wire W. As a result, when the light-emitting module 1 is viewed from above, the wire W is not readily visually recognized, and thus the aesthetics of the appearance of the light-emitting module 1 can be improved.

Fourth Modified Example of Light-Emitting Module

Figure 12:
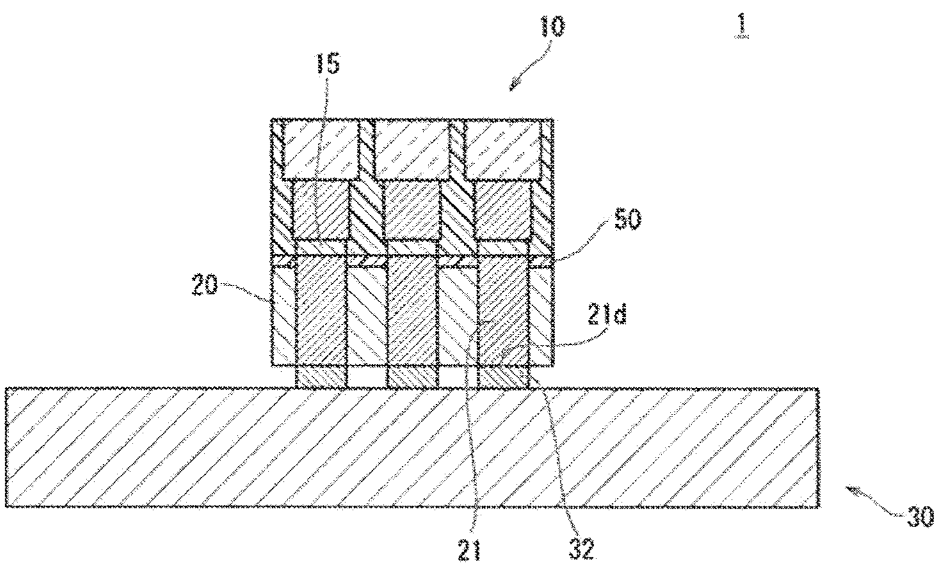
FIG. 12 is a schematic cross-sectional view illustrating a light-emitting module according to a fourth modified example of the other embodiment.

Next, a fourth modified example of the present embodiment will be described with reference to FIG. 12. In the present modified example, unlike the light-emitting modules according to the first embodiment and the second embodiment described above, the mounting substrate 30, the control unit 20, and the light source 10 are electrically connected without using the wire W and the conductive member 14.

Specifically, the control unit 20 includes a connection terminal 21*d* disposed on a lower surface of the control unit 20, and a terminal electrically connected to the connection terminal 21*d* is also disposed on the upper surface of the control unit 20. As an example, as illustrated in FIG. 12, the terminal may be the terminal 21 passing through an interior of the control unit 20. Alternatively, wiring may be performed inside the control unit 20, electrically connecting the terminal of the lower surface and the terminal of the upper surface of the control unit 20.

The connection terminal 21*d* disposed on the lower surface of the control unit 20 faces the wiring portion 32 disposed on the upper surface of the mounting substrate 30, and the connection terminal 21*d* of the control unit 20 and the wiring portion 32 on the upper surface of the mounting substrate 30 are electrically connected. Furthermore, the terminal 21 of the control unit 20 and the electrode 15 of the light-emitting element 11 are electrically connected.

With such a light-emitting module 1, it is possible to electrically connect the mounting substrate 30, the control unit 20, and the light source 10 without using wire bonding, and thus further reduce the size of the light-emitting module.

Fifth Modified Example of Light-Emitting Module

Figure 13:
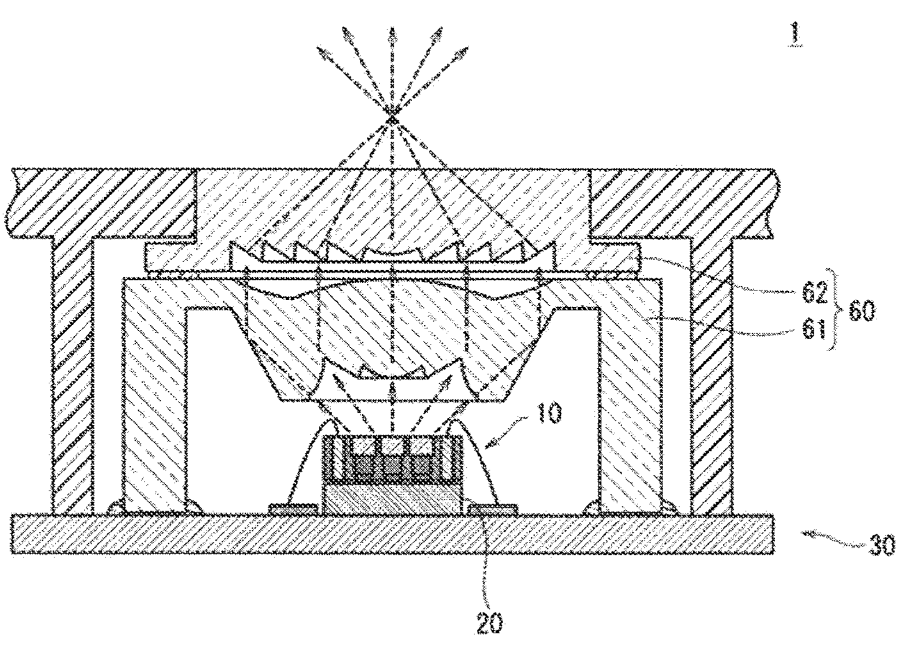
FIG. 13 is a schematic cross-sectional view illustrating a light-emitting module according to a fifth modified example of the other embodiment.

Next, a fifth modified example of the present embodiment will be described with reference to FIG. 13. In the present modified example, a lens 60 is disposed above the light source 10. In the present modified example, the lens 60 is a portion of the light-emitting module 1. As an example, a first lens 61 may be provided on the light source 10, and a second lens 62 may be provided on the first lens 61. The second lens 62 is a Fresnel lens, for example. The Fresnel lens is disposed with a lower surface thereof having protrusions and recessions facing the light source 10 side, causing the light emitted from the light source 10 to be incident on the lens and emitted from a flat upper surface thereof. With use of the Fresnel lens, a thickness of the lens 60 can be reduced. In the light-emitting module 1 according to the present modified example, the light source 10 and the control unit 20 overlap in a height direction, and thus the light-emitting module is thick compared to a light-emitting module in which the light source 10 and the control unit 20 are disposed separately. Therefore, by making the lens 60 or a portion of the lens 60 into a Fresnel lens, it is possible to reduce the thickening of the light-emitting module overall. This makes it possible to reduce the size of the light-emitting module 1.

Methods of Manufacturing Light Source and Light-Emitting Module

Next, methods of manufacturing a light source and a light-emitting module will be described with reference to FIGS. 14A to 14I and FIG. 15.

The method of manufacturing the light source 10 according to the present embodiment includes a preparation step of preparing a light-transmissive sheet, a light-emitting element disposing step, a conductive member disposing step, and a covering step. The method will be described below, following each step.

Preparing Light-Transmissive Sheet

Figure 14A:
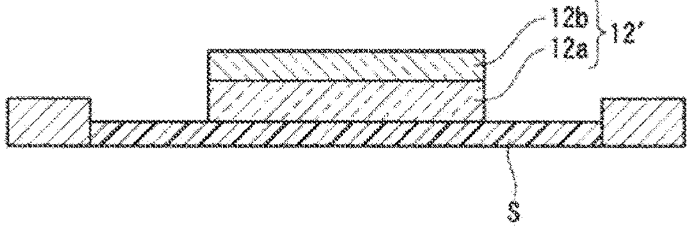
FIG. 14A is a schematic cross-sectional view illustrating a method of manufacturing a light-emitting module according to an embodiment of the present disclosure.

First, as illustrated in FIG. 14A, a light-transmissive sheet 12' including a light diffusion layer 12*a* and a wavelength conversion layer 12*b* is prepared. The light diffusion layer 12*a* contains titanium oxide, barium titanate, aluminum oxide, silicon oxide, or the like, and the wavelength conversion layer 12*b* contains a wavelength conversion substance such as a YAG phosphor.

The light-transmissive sheet 12' may be adhered to a sheet S such as a dicing sheet for processing the light-transmissive sheet 12'. At this time, the light-transmissive sheet 12' may be cut to a desired size in advance. Further, the light-transmissive sheet 12' is disposed with the light diffusion layer 12*a* and the wavelength conversion layer 12*b* in this order from a lower side.

Figure 14B:
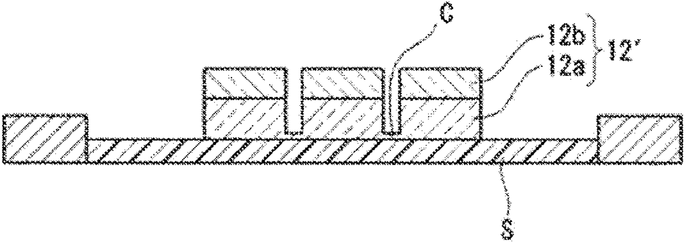
FIG. 14B is a schematic cross-sectional view illustrating the method of manufacturing the light-emitting module according to the embodiment of the present disclosure.

Subsequently, as illustrated in FIG. 14B, providing a plurality of slits C in the light-transmissive sheet 12' correspondingly to each of the plurality of light-emitting elements 11 is performed. In a top view, the plurality of slits C surround predetermined regions where each light-emitting element is to be placed. Providing a plurality of slits C is performed from the wavelength conversion layer 12*b* side. The slit C passes through the wavelength conversion layer 12*b* in a thickness direction and removes a portion of the light diffusion layer 12*a*. In other words, the slit C leaves a portion of the light diffusion layer 12*a*. This allows the light-transmissive sheet 12' to be handled in a partially connected state, facilitating the manufacturing process.

Disposing the Plurality of Light Emitting Elements

Figure 14C:
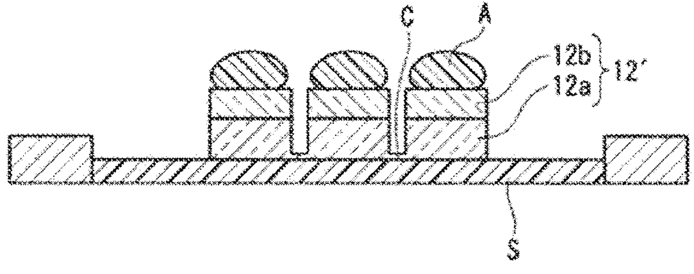
FIG. 14C is a schematic cross-sectional view illustrating the method of manufacturing the light-emitting module according to the embodiment of the present disclosure.
Figure 14D:
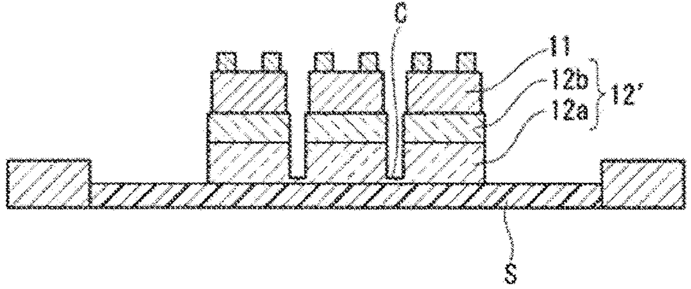
FIG. 14D is a schematic cross-sectional view illustrating the method of manufacturing the light-emitting module according to the embodiment of the present disclosure.

Disposing the plurality of light emitting elements is a step of disposing the plurality of light-emitting elements with respect to the prepared light-transmissive sheet 12', as illustrated in FIGS. 14C and 14D. First, an adhesive A is disposed on the wavelength conversion layer 12*b* of the light-transmissive sheet 12'. Then, the light-emitting elements 11 are disposed on the adhesive A, adhering the light-transmissive sheet 12' and the light-emitting elements 11. Accordingly, the plurality of light-emitting elements 11 can be disposed correspondingly to the slits C provided in the light-transmissive sheet 12'. After the light-emitting elements 11 are disposed on the light-transmissive sheet 12', the sheet is reapplied so that the light-transmissive sheet 12' side is the upper surface.

Disposing Conductive Members

Figure 14E:
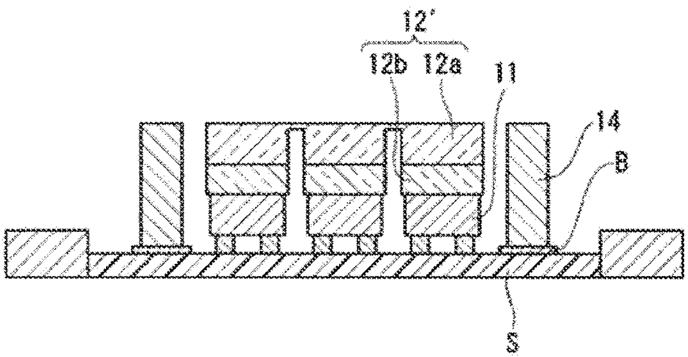
FIG. 14E is a schematic cross-sectional view illustrating the method of manufacturing the light-emitting module according to the embodiment of the present disclosure.

As illustrated in FIG. 14E, disposing conductive members is a step of disposing the plurality of conductive members 14 outward of the plurality of light-emitting elements 11 in a top view.

Figure 15:
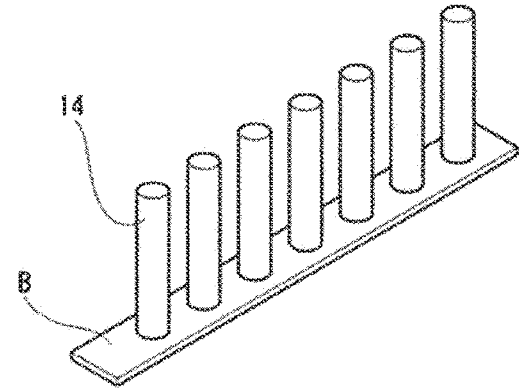
FIG. 15 is a schematic perspective view illustrating a conductive member according to an embodiment of the present disclosure.

As an example of disposing conductive members, a member in which the plurality of conductive members 14 are held on a base B may be prepared as illustrated in FIG. 15, and then the base B and the conductive members 14 may be disposed outward of the light-emitting elements 11. The base B may be any material that can hold the conductive members 14 upright and can be ground in a subsequent step. The material may be, for example, sapphire, silicon, a resin, or a metal. The conductive member 14 is preferably Cu in terms of electrical conductivity, and may have, for example, a pillar shape having a height similar to a thickness of the light source 10.

When the conductive members 14 are thus held by the base B, it is possible to prevent toppling of the conductive members 14 in association with supply of the light-reflective member 13 in the covering step described below. Further, from the perspective of preventing the toppling of the conductive members 14, the width of the conductive member 14 on the base side may be increased to stably hold the conductive members 14 upright.

Although, in the above description, the form of the conductive member is described as pillar-shaped Cu on the base B, the conductive member is not limited to this form and, for example, a form for the conductive member may be adopted in which a plurality of layers of plating are layered. Alternatively, a form may be adopted in which the plurality of conductive members 14 are disposed on the base material 14*i* described in the first modified example.

Alternatively, the conductive members 14 may be disposed outward of the light-emitting elements 11 without using the base B.

Covering with a Light-Reflective Member

Figure 14F:
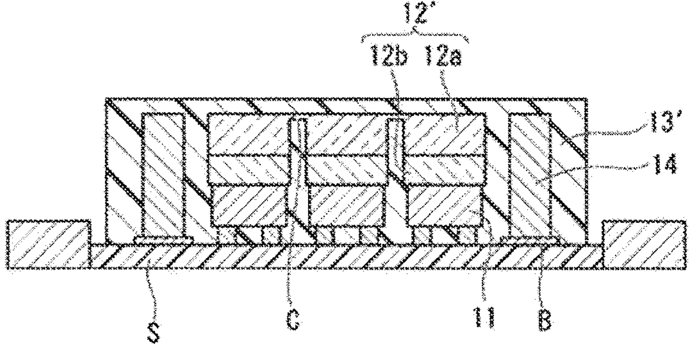
FIG. 14F is a schematic cross-sectional view illustrating the method of manufacturing the light-emitting module according to the embodiment of the present disclosure.

Covering with a light-reflective member is a step of covering the light-transmissive sheet 12', the plurality of light-emitting elements 11, and the plurality of conductive members 14 with a light-reflective member 13', as illustrated in FIG. 14F. As the light-reflective member 13', a resin material containing a light-reflective material such as white pigment is used, for example.

In covering with a light-reflective member, the light-transmissive sheet 12', the plurality of light-emitting elements 11, and the plurality of conductive members 14 are covered and thus completely buried using the light-reflective member 13'. As a result, the light-reflective member 13 is partially disposed in the slits C provided by the slit providing step, making it possible to reduce, at the light-emitting surface, an incidence of light emitted by one light-emitting element 11 through the light-transmissive member onto a light-emitting region irradiated with light by the adjacent light-emitting element through the light-transmissive member. This makes it possible to achieve a light-emitting module having favorable parting properties between a light-emitting region and a non-light-emitting region.

Figure 10A:
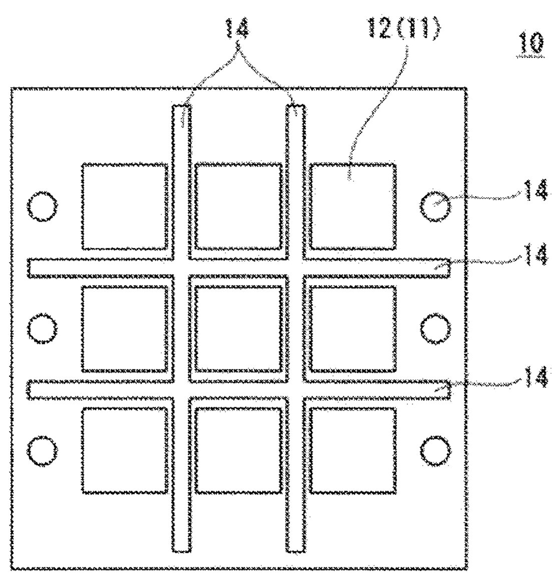
FIG. 10A is a schematic plan view illustrating a light source according to a second modified example of the other embodiment.
Figure 10B:
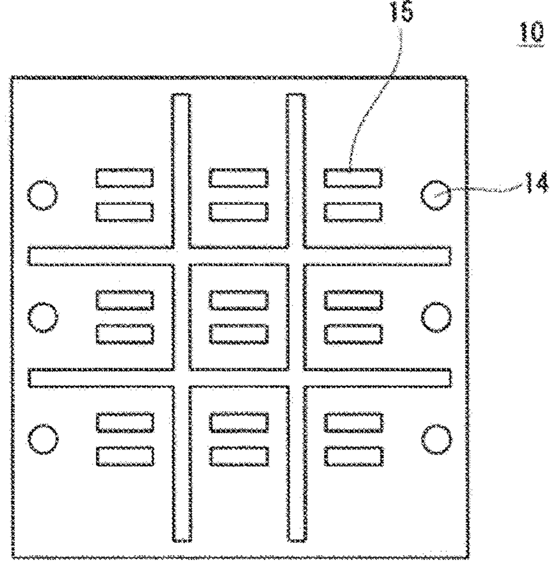
FIG. 10B is a schematic bottom view illustrating the light source according to the second modified example of the other embodiment.

Furthermore, in covering with a light-reflective member, as illustrated in FIGS. 10A and 10B, after the conductive members 14 are disposed so as to define the plurality of light-emitting elements 11, the conductive members 14 defining the light-emitting elements 11 may be covered with the light-reflective member 13'.

Separating the Light-Transmissive Sheet (Additional Step)

Figure 14G:
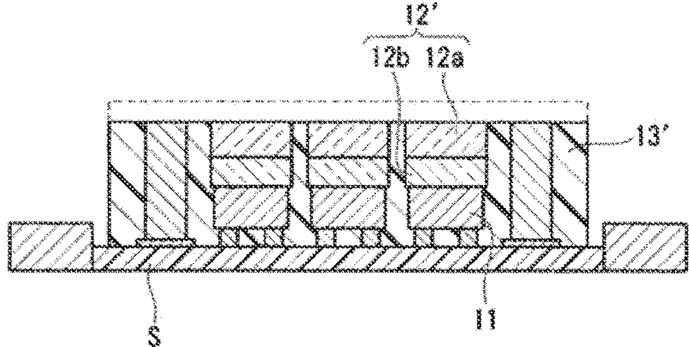
FIG. 14G is a schematic cross-sectional view illustrating the method of manufacturing the light-emitting module according to the embodiment of the present disclosure.

As illustrated in FIG. 14G, after the covering step, the method may include separating the light-transmissive sheet 12' in correspondence with the plurality of light-emitting elements. A portion of the light-reflective member 13' is disposed on an upper surface side of the light-transmissive sheet 12', and the light-transmissive sheet 12' is continuously connected at a portion on the upper surface side. In the separation step, grinding is performed by a grinding device from the upper surface side of the light-transmissive sheet 12', for example. In the separation step, this separation is performed on a per light-emitting element basis by removing a portion where the light-reflective member 13' disposed on the upper surface side of the light-transmissive sheet 12' and the light-transmissive sheet 12' are connected.

Figure 14H:
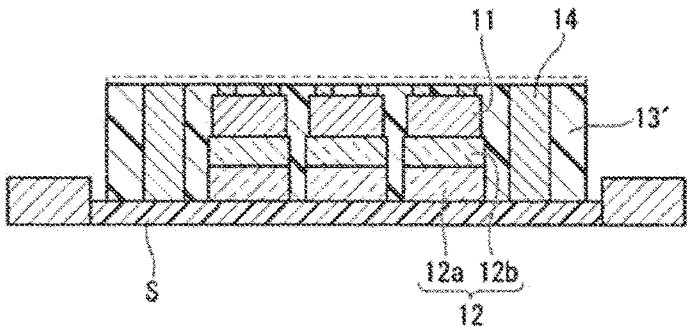
FIG. 14H is a schematic cross-sectional view illustrating the method of manufacturing the light-emitting module according to the embodiment of the present disclosure.
Figure 14I:
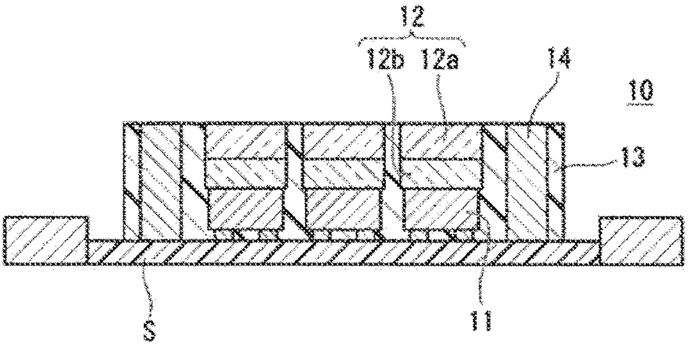
FIG. 14I is a schematic cross-sectional view illustrating the method of manufacturing the light-emitting module according to the embodiment of the present disclosure.

After separating the light-transmissive sheet, as illustrated in FIG. 14H, the sheet is reapplied so that the light-emitting element 11 side is the upper surface, and grinding is performed, exposing the electrodes 15 of the light-emitting elements 11. Thus, the base B supporting the conductive members is simultaneously removed. After exposure of the electrodes 15 of the light-emitting elements 11, the sheet is reapplied once again and the external shape of the light-reflective member 13' is formed to a desired size, as illustrated in FIG. 14I. Thus, the light source 10 used in a light-emitting module can be manufactured.

After manufacture of the light source 10, the method includes preparing the light source 10 and the control unit 20 that individually controls the plurality of light-emitting elements 11, and electrically connecting the light source 10 and the control unit 20. Specifically, the terminals 21 of the control unit 20 and the electrodes 15 of the light source 10 are electrically connected by a conductive joining member.

Subsequently, in order to firmly adhere the control unit 20 and the light source 10, the method may further include, after connecting the light source 10 and the control unit 20, adhering the control unit 20 and the light source 10 via the insulating joining member 50.

Subsequently, the method may further include, after connecting the light source 10 and the control unit 20, disposing the control unit 20 on the mounting substrate 30 and electrically connecting the mounting substrate 30 and the plurality of conductive members 14. Specifically, after electrical connection of the control unit 20 and the light source 10, the mounting substrate 30 that mounts the control unit 20 and the light source 10 is prepared. Then, the control unit 20 is disposed on the mounting substrate 30 and electrically connects the mounting substrate 30 and the plurality of conductive members 14. For example, in the case of manufacture of the light-emitting module 1 according to the second embodiment, the mounting substrate 30 and the plurality of conductive members 14 are electrically connected by wire bonding. For example, in the case of manufacture of the light-emitting module illustrated in FIG. 12, the electrical connection is made by a conductive joining member. Further, for example, as illustrated in FIG. 11, the plurality of conductive members 14 exposed from the light-reflective member 13 may be covered by the resin member 40. Further, the resin member 40 may cover the wire W.

Subsequently, for example, in the case of manufacture of the light-emitting module 1 illustrated in FIG. 13, the method may include disposing a desired lens on the mounting substrate.

Note that the implementations disclosed in the present disclosure are illustrative in all respects and are not the basis of limiting interpretation. Accordingly, the technical scope of the present disclosure is not construed solely by the implementations described above, but is defined on the basis of the description of the scope of claims. In addition, the technical scope of the present disclosure includes all modifications within the meaning and scope equivalent to the scope of claims.

The light-emitting module and the method of manufacturing a light-emitting module according to the present disclosure include the following aspects.

Aspect 1

A light-emitting module including a light source including a plurality of light-emitting elements, a plurality of light-transmissive members respectively disposed on each of the plurality of light-emitting elements, and a light-reflective member covering at least a portion of the plurality of light-emitting elements and the plurality of light-transmissive members; and a control unit that disposes the light source on an upper surface of control unit and that is configured to individually control the plurality of light-emitting elements, the light-reflective member being disposed between light-transmissive members of the light-transmissive members that are adjacent to each other.

Aspect 2

The light-emitting module described in aspect 1, further including a plurality of conductive members provided in an interior of the light-reflective member, the plurality of conductive members each including a first end portion exposed from a lower surface of the light-reflective member, and a second end portion exposed from an upper surface of the light-reflective member, wherein the first end portion of each of the plurality of conductive members is electrically connected to an external connection terminal positioned on the upper surface of the control unit.

Aspect 3

The light-emitting module described in aspect 2, wherein the plurality of conductive members are each positioned between an end portion of the light source and a light-emitting element of the plurality of the light-emitting elements that is positioned at an outermost portion, in a top view.

Aspect 4

The light-emitting module described in aspect 2 or 3, further including a mounting substrate in which a wiring portion disposed on an upper surface of a base member, wherein the control unit is disposed on the mounting substrate, and the second end portion of each of the plurality of conductive members exposed from the light-reflective member, and the wiring portion positioned on the mounting substrate are electrically connected by a wire, on the upper surface of the light-reflective member.

Aspect 5

The light-emitting module described in aspect 2 or 3, further including a mounting substrate including a wiring portion disposed on an upper surface of a base member, wherein the control unit is disposed on the mounting substrate with a connection terminal disposed on a lower surface of the control unit and a wiring portion disposed on an upper surface of the mounting substrate facing each other.

Aspect 6

The light-emitting module described in any one of aspects 1 to 5, further including an insulating joining member disposed between the light source and the control unit.

Aspect 7

A light-emitting module including: a light source including a plurality of light-emitting elements and a light-reflective member covering at least a portion of the plurality of light-emitting elements; a mounting substrate positioned on a lower side of the light source, the mounting substrate including a wiring portion disposed on an upper surface of a base member; and a plurality of conductive members provided in an interior of the light-reflective member and each including a first end portion exposed from a lower surface of the light-reflective member, and a second end portion exposed from an upper surface of the light-reflective member, wherein the second end portion of each of the plurality of conductive members exposed from the light-reflective member and the wiring portion on the mounting substrate are electrically connected on the upper surface of the light-reflective member.

Aspect 8

The light-emitting module described in aspect 7 further including a control unit disposed between the mounting substrate and the light source and configured to individually control the plurality of light-emitting elements, wherein an external connection terminal positioned on an upper surface of the control unit and electrically connected to the first end portion of each of the plurality of conductive members exposed from the light-reflective member on the lower surface of the light-reflective member.

Aspect 9

The light-emitting module described in aspect 8, wherein the control unit is disposed on the mounting substrate with a connection terminal disposed on a lower surface of the control unit and a wiring portion disposed on an upper surface of the mounting substrate facing each other.

Aspect 10

The light-emitting module described in aspect 8 or 9, further including an insulating joining member disposed between the light source and the control unit.

Aspect 11

The light-emitting module described in any one of aspects 7 to 10, wherein the second end portion of each of the plurality of conductive members exposed from the light-reflective member, and the wiring portion positioned on the mounting substrate are electrically connected by a wire, on the upper surface of the light-reflective member.

Aspect 12

The light-emitting module described in any one of aspects 7 to 11, wherein the plurality of conductive members are each positioned between an end portion of the light source and a light-emitting element of the plurality of the light-emitting elements that is positioned at an outermost portion, in a top view.

Aspect 13

The light-emitting module described in any one of aspects 2 to 12, wherein the second end portion of each of the plurality of conductive members exposed from the light-reflective member is covered by a resin member on the upper surface of the light-reflective member.

Aspect 14

The light-emitting module described in aspect 13 quoting aspect 4 or 11, wherein the resin member covers the wire.

Aspect 15

The light-emitting module described in any one of Aspects 2 to 14, wherein a width of the second end portion of each of the plurality of conductive members is smaller than a width of the first end portion of the corresponding one of the plurality of conductive members.

Aspect 16

The light-emitting module described in any one of aspects 2 to 15, further including a holding member including the plurality of conductive members and a base material in which the plurality of conductive members are disposed, the holding member being provided in the light-reflective member.

Aspect 17

The light-emitting module described in any one of aspects 2 to 16, wherein at least one of the plurality of conductive members is disposed on an extending line of the light-reflective member between, among the plurality of light-emitting elements, the light-emitting elements that are adjacent to each other.

Aspect 18

The light-emitting module described in any one of aspects 1 to 17, wherein a lens is disposed above the light source.

Aspect 19

A method of manufacturing a light source, the method including: preparing a light-transmissive sheet; disposing a plurality of light-emitting elements with respect to the light-transmissive sheet; disposing a plurality of conductive members outward of the plurality of light-emitting elements in a top view; and covering at least a portion of the light-transmissive sheet, the plurality of light-emitting elements, and the plurality of conductive members with a light-reflective member.

Aspect 20

The method of manufacturing a light source described in aspect 19, wherein the preparing includes providing a plurality of slits in the light-transmissive sheet correspondingly to each of the plurality of light-emitting elements.

Aspect 21

The method of manufacturing a light source described in aspect 20, wherein, in the covering, a portion of the light-reflective member is disposed in each of the plurality of slits.

Aspect 22

The method of manufacturing a light source described in any one of aspects 19 to 21, further including, after the covering, separating the light-transmissive sheet in correspondence with the plurality of light-emitting elements.

Aspect 23

A method of manufacturing a light-emitting module, the method including, after the method of manufacturing a light source described in any one of aspects 19 to 22, electrically connecting the light source and a control unit configured to individually control the plurality of light-emitting elements.

Aspect 24

The method of manufacturing a light-emitting module described in aspect 23, further including, after electrically connecting, disposing the control unit on a mounting substrate and electrically connecting the mounting substrate and the plurality of conductive members.

What is claimed is:

1. A light-emitting module comprising:
- a light source comprising:
  - a plurality of light-emitting elements,
  - a plurality of light-transmissive members, each disposed on a respective one of the plurality of light-emitting elements, and
  - a light-reflective member covering at least a portion of the plurality of light-emitting elements and the plurality of light-transmissive members, wherein a portion of the light-reflective member is located between adjacent ones of the plurality of light-transmissive members;
- a holding member comprising:
  - a plurality of conductive members located in the light-reflective member, each of the plurality of conductive members comprising:
    - a first end portion exposed from the light-reflective member at a lower surface of the light-reflective member; and
    - a second end portion exposed from the light-reflective member at an upper surface of the light-reflective member, and
  - a base material in which the plurality of conductive members are located, the holding member being located in the light-reflective member; and
- a control unit having an upper surface on which the light source is located, wherein the control unit is configured to individually control the plurality of light-emitting elements; wherein:
- the first end portion of each of the plurality of conductive members is electrically connected to an external connection terminal located on the upper surface of the control unit;
- the light-reflective member is exposed from a top surface of the light-emitting module; and
- the upper surface of the light-reflective member is flush with an upper surface of the plurality of light-transmissive members.

2. The light-emitting module according to claim 1, wherein:
- in a top view, each of the plurality of conductive members is located between an outer end portion of the light source and a respective outermost one of the plurality of light-emitting elements.

3. The light-emitting module according to claim 1, further comprising:
- a mounting substrate comprising:
  - a base member, and
  - a wiring portion located on an upper surface of the base member; wherein:
  - the control unit is located on the mounting substrate; and
  - the second end portion of each of the plurality of conductive members is electrically connected to the wiring portion located on the mounting substrate by a wire.

4. The light-emitting module according to claim 3, further comprising:
- a resin member, a portion of which covers a portion of the upper surface of the light-reflective member and the second end portion of each of the plurality of conductive members.

5. The light-emitting module according to claim 4, wherein the resin member covers the wire.

6. The light-emitting module according to claim 1, further comprising:
- a mounting substrate comprising:
  - a base member, and
  - a wiring portion located on an upper surface of the base member; wherein:
  - the control unit is located on the mounting substrate with a connection terminal located at a lower surface of the control unit facing a wiring portion located on an upper surface of the mounting substrate.

7. The light-emitting module according to claim 1, further comprising:
- an insulating joining member located between the light source and the control unit.

8. The light-emitting module according to claim 1, wherein:
- in each of the plurality of conductive members, a width of the second end portion is less than a width of the first end portion.

9. The light-emitting module according to claim 1, wherein:
- in a top view, at least one of the plurality of conductive members extends on a line on which the light-reflective member extends between adjacent ones of the plurality of light-emitting elements.

10. The light-emitting module according to claim 1, wherein a lens is located above the light source.

11. The light-emitting module according to claim 1, wherein the light-reflective member is formed of a single monolithic piece of continuous material.

12. The light-emitting module according to claim 1, wherein the light-reflective member is a resin material containing a white pigment.

13. A light-emitting module comprising:
- a light source comprising:
  - a plurality of light-emitting elements, and
  - a light-reflective member covering at least a portion of the plurality of light-emitting elements;
- a mounting substrate positioned on a lower side of the light source, the mounting substrate comprising:
  - a base member, and
  - a wiring portion located on an upper surface of the base member; and
- a plurality of conductive members located in the light-reflective member, each of the plurality of conductive members comprising:

a first end portion exposed from the light-reflective member at a lower surface of the light-reflective member, and a second end portion exposed from the light-reflective member at an upper surface of the light-reflective member; wherein:

the second end portion of each of the plurality of conductive members is electrically connected to the wiring portion located on the mounting substrate; and the second end portion of each of the plurality of conductive members is electrically connected to the wiring portion located on the mounting substrate by a wire.

14. The light-emitting module according to claim 13, further comprising:

a control unit located between the mounting substrate and the light source and configured to individually control the plurality of light-emitting elements; wherein:

the first end portion of each of the plurality of conductive members is electrically connected to an external connection terminal located on an upper surface of the control unit.

15. The light-emitting module according to claim 14, wherein:

the control unit is located on the mounting substrate with a connection terminal located at a lower surface of the control unit facing a wiring portion located on an upper surface of the mounting substrate.

16. The light-emitting module according to claim 14, further comprising:

an insulating joining member located between the light source and the control unit.

17. The light-emitting module according to claim 13, wherein:

in a top view, each of the plurality of conductive members is located between an outer end portion of the light source and a respective outermost one of the plurality of light-emitting elements.

18. A light-emitting module comprising:

a light source comprising:

a plurality of light-emitting elements, and a light-reflective member covering at least a portion of the plurality of light-emitting elements;

a mounting substrate positioned on a lower side of the light source, the mounting substrate comprising:

a base member, and a wiring portion located on an upper surface of the base member;

a holding member comprising:

a plurality of conductive members located in the light-reflective member, each of the plurality of conductive members comprising:

a first end portion exposed from the light-reflective member at a lower surface of the light-reflective member; and a second end portion exposed from the light-reflective member at an upper surface of the light-reflective member, and a base material in which the plurality of conductive members are located, the holding member being located in the light-reflective member; wherein:

the second end portion of each of the plurality of conductive members is electrically connected to the wiring portion located on the mounting substrate.

* * * * *